(12) United States Patent
Tanaka et al.

(10) Patent No.: US 12,271,044 B2
(45) Date of Patent: Apr. 8, 2025

(54) OPTO-ELECTRIC HYBRID BOARD

(71) Applicant: NITTO DENKO CORPORATION, Osaka (JP)

(72) Inventors: Naoyuki Tanaka, Osaka (JP); Seiki Teraji, Osaka (JP); Koya Osuka, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 123 days.

(21) Appl. No.: 17/788,955

(22) PCT Filed: Dec. 23, 2020

(86) PCT No.: PCT/JP2020/048180
§ 371 (c)(1),
(2) Date: Jun. 24, 2022

(87) PCT Pub. No.: WO2021/132339
PCT Pub. Date: Jul. 1, 2021

(65) Prior Publication Data
US 2023/0341642 A1    Oct. 26, 2023

(30) Foreign Application Priority Data
Dec. 27, 2019  (JP) .................. 2019-238789

(51) Int. Cl.
G02B 6/42    (2006.01)
(52) U.S. Cl.
CPC ......... G02B 6/4293 (2013.01); G02B 6/4214 (2013.01); G02B 6/4277 (2013.01); G02B 6/4283 (2013.01)
(58) Field of Classification Search
CPC .. G02B 6/4214; G02B 6/4277; G02B 6/4283; G02B 6/4293
See application file for complete search history.

(56) References Cited

U.S. PATENT DOCUMENTS 8,867,868 B2    10/2014 Kushiyama et al.
2008/0285910 A1  11/2008 Yamada et al.
(Continued)

FOREIGN PATENT DOCUMENTS

CN    107209324 A    9/2017
JP    2010-113102 A   5/2010
(Continued)

OTHER PUBLICATIONS

Haga et al. "Reduction in radiated emission from multilayer PCBs by the layer structure shielding a power plane", Electronics and Communications in Japan, Part I: Communications, 2004 (Year: 2004).*

(Continued)

*Primary Examiner* — Michelle R Connelly
*Assistant Examiner* — Kirsten D. Endresen
(74) *Attorney, Agent, or Firm* — Edwards Neils LLC; Jean C. Edwards, Esq.

(57) ABSTRACT

An opto-electric hybrid board that sequentially includes an optical waveguide and an electric circuit board toward one side in a thickness direction. The electric circuit board includes a metal supporting layer, an insulating base layer disposed on a one-side surface in the thickness direction of the metal supporting layer, a plurality of conductive layers sequentially disposed at one side in the thickness direction, and an intermediate insulating layer disposed between the conductive layers. At least one layer selected from the group consisting of the metal supporting layer and the conductive layers is electrically insulated from the other layers.

4 Claims, 10 Drawing Sheets

(56) References Cited

U.S. PATENT DOCUMENTS

| | | | |
|---|---|---|---|
| 2010/0209041 A1* | 8/2010 | Matsushima | H05K 1/0274 |
| | | | 385/88 |
| 2012/0014641 A1 | 1/2012 | Maetani et al. | |
| 2014/0177998 A1 | 6/2014 | Tseng | |
| 2014/0369642 A1 | 12/2014 | Yanagisawa | |
| 2017/0329079 A1 | 11/2017 | Tsujita et al. | |
| 2017/0329093 A1 | 11/2017 | Tanaka et al. | |
| 2018/0331037 A1* | 11/2018 | Mohammed | H01L 21/8221 |
| 2020/0150359 A1 | 5/2020 | Konegawa et al. | |

FOREIGN PATENT DOCUMENTS

| | | | | |
|---|---|---|---|---|
| JP | 2010-199405 A | | 9/2010 | |
| JP | 2014-240933 A | | 12/2014 | |
| JP | 2016105160 A | * | 6/2016 | ............. G02B 6/122 |
| JP | 2018-173514 A | | 11/2018 | |
| TW | 201626011 A | | 7/2016 | |
| WO | 2010/113968 A1 | | 10/2010 | |

OTHER PUBLICATIONS

International Search Report issued in PCT/JP2020/048180 on Mar. 30, 2021.

Written Opinion issued in PCT/JP2020/048180 on Mar. 30, 2021.

International Preliminary Report on Patentability issued by WIPO on Jun. 28, 2022, in connection with International Patent Application No. PCT/JP2020/048180.

Office Action, issued by the Taiwanese Intellectual Property Office on Sep. 26, 2024, in connection with Taiwanese Patent Application No. 109146221.

Office Action issued by the China National Intellectual Property Administration on Aug. 13, 2024, in connection with Chinese Patent Application No. 202080088881.0.

Office Action, issued by the Taiwanese Intellectual Property Office on Jun. 20, 2024, in connection with Taiwanese Patent Application No. 109146221.

Office Action issued by the China National Intellectual Property Administration on Dec. 28, 2024, in connection with Chinese Patent Application No. 202080088881.0.

Office Action which was issued by the Japanese Patent Office on Feb. 4, 2025, in connection with Japanese Patent Application No. 2020-213596.

* cited by examiner

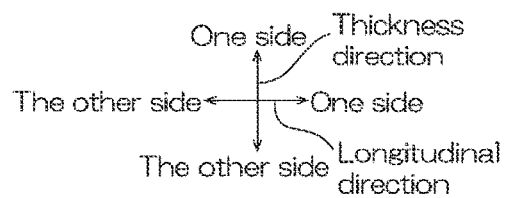
FIG. 2A
FIG. 2B
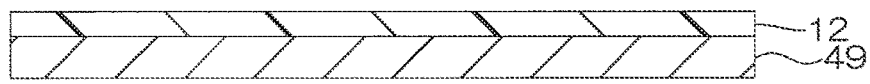
FIG. 2C
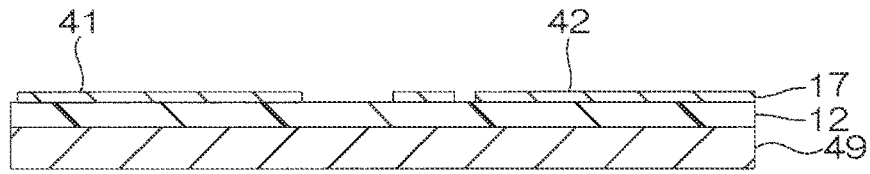
FIG. 2D
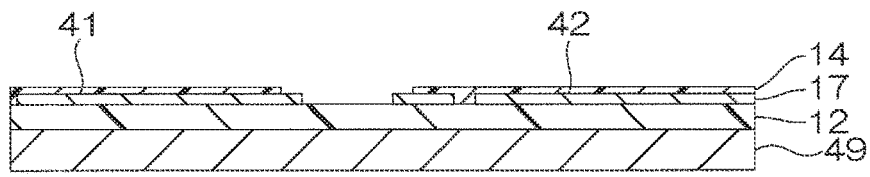
FIG. 2E
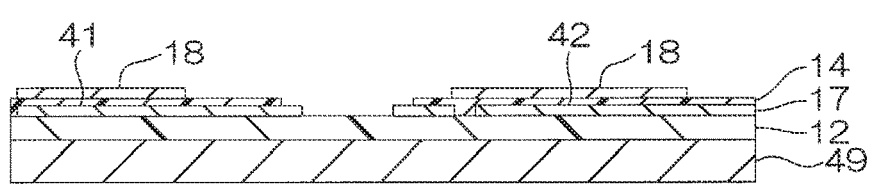
FIG. 2F
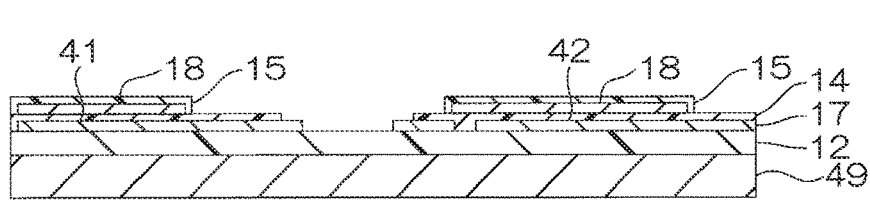
FIG. 2G
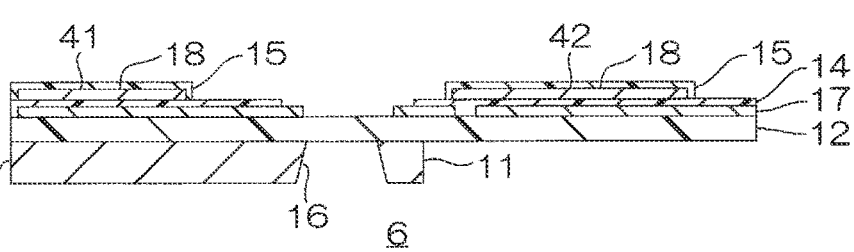

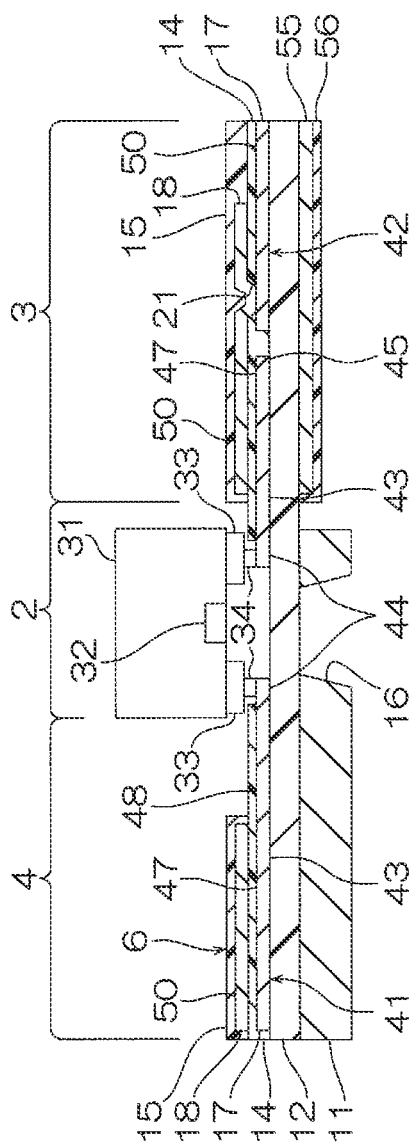
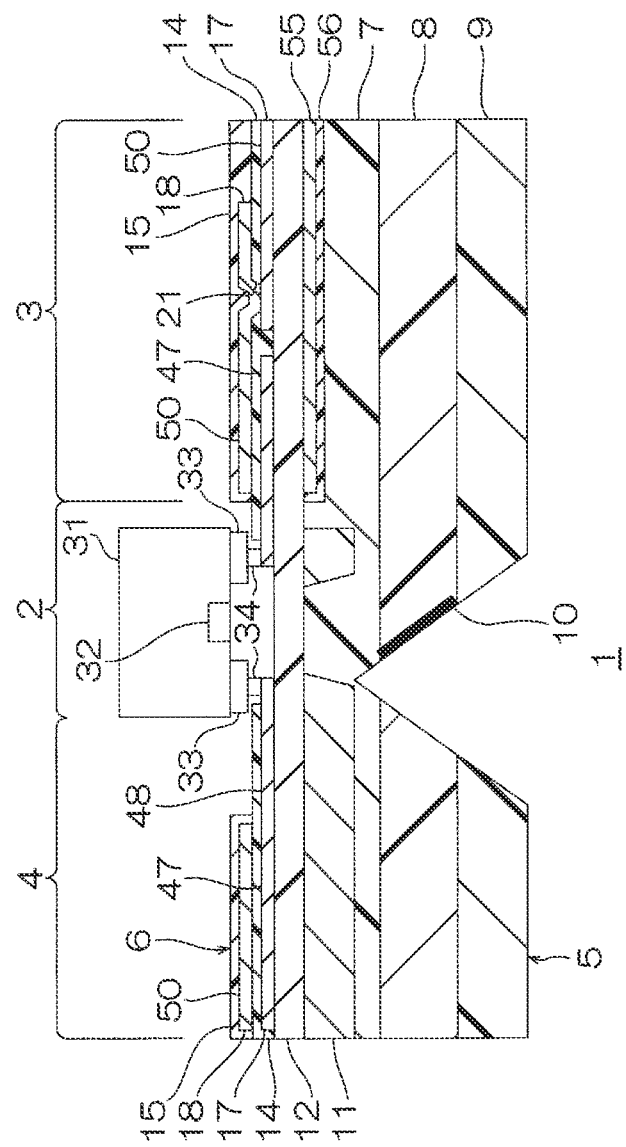

OPTO-ELECTRIC HYBRID BOARD

CROSS-REFERENCE TO RELATED APPLICATIONS

The present application is a 35 U.S.C. 371 National Stage Entry of: PCT/JP2020/048180, filed on Dec. 23, 2020, which claims priority from Japanese Patent Application No. 2019-238789, filed on Dec. 27, 2019, the contents of all of which are herein incorporated by reference in their entirety.

BACKGROUND ART

Conventionally, an opto-electric hybrid board sequentially including an optical waveguide and a flexible printed board in a thickness direction has been known.

For example, an opto-electric hybrid board including an optical waveguide and a flexible printed board having a plurality of wiring patterns has been proposed (for example, see Patent document 1 below).

CITATION LIST

Patent Document

Patent Document 1: Japanese Unexamined Patent Publication No. 2010-113102

SUMMARY OF THE INVENTION

Problem to be Solved by the Invention

In these years, suppression of the noise to such wiring patterns has been required.

However, the opto-electric hybrid board of Patent Document 1 does not meet the requirement.

The present invention provides an opto-electric hybrid board that excellently suppresses the noise.

Means for Solving the Problem

The present invention [1] includes an opto-electric hybrid board comprising: an optical waveguide; and an electric circuit board sequentially toward one side in a thickness direction, wherein the electric circuit board includes a metal supporting layer, an insulating base layer disposed on a one-side surface in the thickness direction of the metal supporting layer, a plurality of conductive layers sequentially disposed in the thickness direction and including a first conductive layer disposed on a one-side surface in the thickness direction of the insulating base layer, and an intermediate insulating layer disposed between the conductive layers, and at least one layer selected from the group consisting of the metal supporting layer and the conductive layers is a shield layer electrically insulated from the other layers of the group.

In the present invention, at least one layer selected from the group consisting of the metal supporting layer and conductive layers is a shield layer, and thus can suppress the noise to the other layers.

The present invention [2] includes the opto-electric hybrid board described in [1], wherein at least one of the conductive layers includes a terminal for mounting an optical element, and the terminal is disposed on the one-side surface in the thickness direction of the insulating base layer.

However, if the terminal is disposed on a one-side surface in the thickness direction of the intermediate insulating layer and an optical element is mounted thereon, the intermediate insulating layer and insulating base layer intervene between the optical element and the optical waveguide and thus the distance between the optical element and the optical waveguide is relatively long.

On the other hand, as the present invention does, when the optical element is mounted on the terminal disposed on the one-side surface in the thickness direction of the insulating base layer, only the insulating base layer intervenes between the optical element and the optical waveguide without the intervention by the intermediate insulating layer and thus the distance between the optical element and the optical waveguide in the thickness direction can be shortened.

Thus, the optical coupling loss between the optical element and the optical waveguide can be reduced.

The present invention [3] includes the opto-electric hybrid board described in [1] or [2], wherein the shield layer overlaps the other layers of the group in the thickness direction.

The opto-electric hybrid board can surely suppress the noise on the other layers by using the shield layer.

The present invention [4] includes the opto-electric hybrid board described in any one of [1] to [3], wherein the other layers of the group include a power-source wire and a signal wire.

The opto-electric hybrid board can simultaneously transmit signals and electricity by using the power-source wire and the signal wire.

The present invention [5] includes the opto-electric hybrid board described in any one of [1] to [4], wherein the first conductive layer includes a power-source wire and/or a signal wire, and the metal supporting layer and a second conductive layer adjacent to one side in the thickness direction of the first conductive layer among the conductive layers are shield layers.

The opto-electric hybrid board can transmit signals and/or electricity by using the first conductive layer that is the power-source wire and/or the signal wire. In addition, the first conductive layer is held between the metal supporting layer and the second conductive layer, both of which are shield layers, from both sides in the thickness direction. Thus, the noise suppression effect on the first conductive layer can be improved.

The present invention [6] includes the opto-electric hybrid board described in [2], wherein the metal supporting layer overlaps the terminal in the thickness direction.

Even when vibrations are given to mount the optical element on the terminal, the terminal of the opto-electric hybrid board overlaps the metal supporting layer and can suppress the passing of the vibrations to the outside. Thus, the joining member provided in the terminal allows the optical element to surely be mounted on the terminal.

Effects of the Invention

The opto-electric hybrid board of the present invention can excellently suppress noise.

BRIEF DESCRIPTION OF THE DRAWINGS

FIG. 2A through FIG. 2G illustrate steps for producing the opto-electric hybrid board illustrated in FIG. 1. FIG. 2A illustrates a step of preparing a metal sheet. FIG. 2B illustrates a step of forming an insulating base layer. FIG. 2C illustrates a step of forming a first conductive layer. FIG. 2D illustrates a step of forming an intermediate insulating layer. FIG. 2E illustrates a step of forming a second conductive layer. FIG. 2F illustrates a step of forming an insulating cover layer. FIG. 2G illustrates a step of forming a metal supporting layer.

FIG. 3 Subsequently to FIG. 2G, FIG. 3H to FIG. 3K illustrate steps for producing the opto-electric hybrid board illustrated in FIG. 1.

FIG. 7A and FIG. 7B illustrate steps for producing a variations of the opto-electric hybrid board illustrated in FIG. 1 (an opto-electric hybrid board further including the other-side conductive layer and the other-side insulating layer). FIG. 7A illustrates a step of forming the other-side conductive layer and the other-side insulating layer. FIG. 7B illustrates a step of forming an optical waveguide.

DESCRIPTION OF THE EMBODIMENTS

One Embodiment

Figure 1:
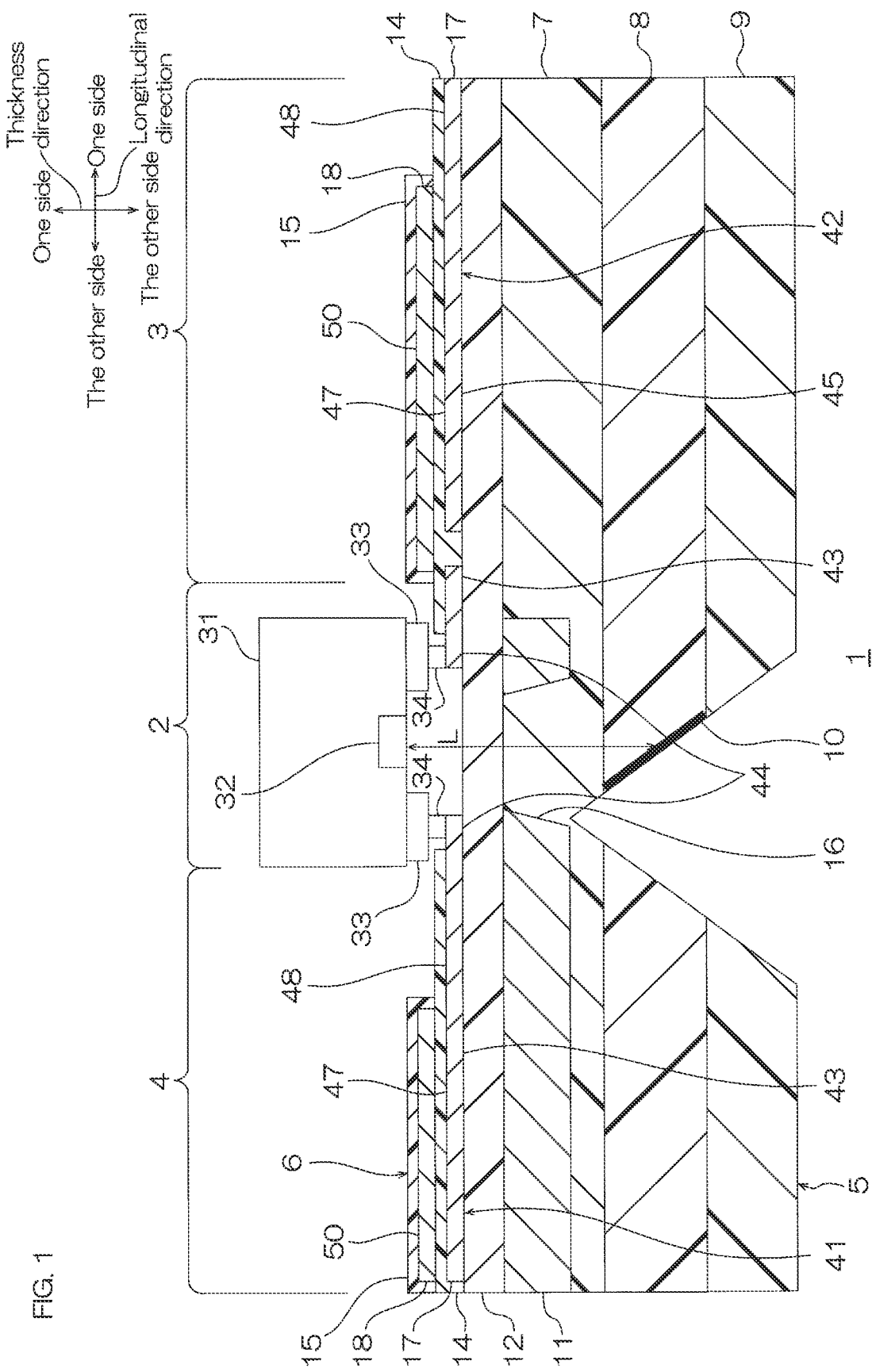
FIG. 1 is a cross-sectional view of one embodiment of the opto-electric hybrid board of the present invention.

One embodiment of the opto-electric hybrid board of the present invention is described with reference to FIG. 1.

An opto-electric hybrid board 1 has a predetermined thickness and a flat belt shape extending in a longitudinal direction orthogonal to a thickness direction. An optical element 31 is mounted on the opto-electric hybrid board 1. The opto-electric hybrid board 1 receives optical signals, converts them into electrical signals with the optical element 31, and transmits the electrical signals and/or receives electrical signals, converts them into optical signals with the optical element 31, and transmits the optical signals (a weak electricity of, for example, less than 50 mW, further, less than 10 mW). Separately from the above-described electrical signals, the opto-electric hybrid board 1 transmits a power source current (a large amount of current of, for example, 10 mA or more, further, 100 mA or more).

The opto-electric hybrid board 1 includes a mounting region 2, a first region 3, and a second region 4.

The mounting region 2 is a region for mounting the optical element 31. The mounting region 2 is located at an intermediate portion in the longitudinal direction of the opto-electric hybrid board 1.

The first region 3 is disposed at one side in the longitudinal direction of the mounting region 2. The first region 3 continues to one edge in the longitudinal direction of the mounting region 2.

The second region 4 is disposed at the other side in the longitudinal direction of the mounting region 2. The second region 4 continues to the other edge in the longitudinal direction of the mounting region 2.

Accordingly, in the opto-electric hybrid board 1, the second region 4, the mounting region 2, and the first region 3 are sequentially disposed from the other side to the one side in the longitudinal direction.

Further, the opto-electric hybrid board 1 includes an optical waveguide 5 and an electric circuit board 6 sequentially toward the one side in the thickness direction.

The optical waveguide 5 is the other-side part in the thickness direction of the opto-electric hybrid board 1. The optical waveguide 5 has the same outer shape as that of the opto-electric hybrid board 1. In other words, the optical waveguide 5 has a shape extending along the longitudinal direction. The optical waveguide 5 includes an under-cladding layer 7, a core layer 8, and an over-cladding layer 9.

The under-cladding layer 7 has the same outer shape as that of the optical waveguide 5 in a plan view.

The core layer 8 is disposed at a central portion in a width direction (a direction orthogonal to the thickness direction and the longitudinal direction, and a direction of the thickness of the drawing sheet of FIG. 1) of the other-side surface in the thickness direction of the under-cladding layer 7. The core layer 8 has a smaller width than that of the under-cladding layer 7 in the plan view.

The over-cladding layer 9 is disposed on the other-side surface in the thickness direction of the under-cladding layer 7 to cover the core layer 8. The over-cladding layer 9 has the same outer shape as that of the under-cladding layer 7 in the plan view. Specifically, the over-cladding layer 9 is disposed on the other-side surface in the thickness direction of the core layer 8, on both side surfaces in the width direction of the core layer 8, and at both outsides in the width direction of the core layer 8 on the other-side surface in the thickness direction of the under-cladding layer 7. The core layer 8 has a higher refractive index than that of each of the under-cladding layer 7 and the over-cladding layer 9.

The core layer 8 includes a mirror 10 formed in the mounting region 2.

Examples of the material of the optical waveguide 5 include transparent materials such as epoxy resins. The optical waveguide 5 has a thickness of, for example, 10 μm or more and, for example, 200 μm or less.

The electric circuit board 6 is disposed on a one-side surface in the thickness direction of the optical waveguide 5. The electric circuit board 6 includes a metal supporting layer 11, an insulating base layer 12, a plurality of conductive layers 17 and 18, an intermediate insulating layer 14, and an insulating cover layer 15.

The metal supporting layer 11 is disposed in the mounting region 2 and the second region 4. The metal supporting layer 11 is located at the outermost side of the other side in the thickness direction of the mounting region 2 and second region 4 in the opto-electric hybrid board 1. The metal supporting layer 11 has an approximately flat board shape extending in the longitudinal direction. The metal supporting layer 11 has an opening portion 16 penetrating in the thickness direction. The opening portion 16 is formed in the mounting region 2.

The metal supporting layer 11 further includes a ground portion that can connect with an external ground member at the other edge that is not illustrated in the longitudinal direction. Thus, the metal supporting layer 11 is a shield layer.

Examples of the material of the metal supporting layer 11 include metals such as 42 alloys, aluminum, copper-beryllium, phosphor bronze, copper, silver, aluminum, and stainless steels. To ensure excellent stiffness and toughness, a stainless steel is preferable. The metal supporting layer 11 has a thickness of, for example, 3 µm or more, preferably 10 µm or more, and, for example, 100 µm or less, preferably 50 µm or less.

The insulating base layer 12 is disposed throughout the mounting region 2, the first region 3, and the second region 4. The insulating base layer 12 is disposed on a one-side surface in the thickness direction of the metal supporting layer 11 in the mounting region 2 and second region 4. The insulating base layer 12 is disposed on a one-side surface in the thickness direction of the under-cladding layer 7 in the first region 3. The insulating base layer 12 has an approximately flat board shape extending in the longitudinal direction. Examples of the material of the insulating base layer 12 include resins such as polyimide. The insulating base layer 12 has a thickness of, for example, 2 µm or more, and, for example, 50 µm or less.

The conductive layers 17 and 18 are located at one side in the thickness direction of the insulating base layer 12. The conductive layers 17 and 18 are a first conductive layer 17 and a second conductive layer 18, respectively. The first conductive layer 17 and the second conductive layer 18 are sequentially disposed from the other side toward the one side in the thickness direction.

The first conductive layer 17 is disposed on a one-side surface in the thickness direction of the insulating base layer 12. The first conductive layer 17 is disposed at the one side in the thickness direction of the metal supporting layer 11 through the insulating base layer 12. Thus, the first conductive layer 17 is electrically insulated from the metal supporting layer 11. The first conductive layer 17 includes, for example, a signal pattern 41 and a power-source pattern 42.

The signal pattern 41 is disposed in the mounting region 2 and the second region 4. The signal pattern 41 integrally includes a signal wire 43, a first terminal 44 that exemplifies a terminal, and a second terminal that is not illustrated.

The signal wire 43 couples the first terminal 44 with the second terminal not illustrated.

The first terminal 44 is disposed in the mounting region 2. The first terminal 44 overlaps the metal supporting layer 11 in the thickness direction. For example, a plurality of the first terminals 44 is disposed in the longitudinal direction and separated from each other by an interval. One end of the signal wire 43 is connected to the first terminal 44. An electrode 33 (described below) of the optical element 31 is joined to the first terminal 44 via a bump 34 (described below).

The second terminal not illustrated is disposed in the second region 4, and the other end of the signal wire 43 is connected the second terminal. An external board that is not illustrated (for example, a printed wiring board) is connected to the second terminal.

The power-source pattern 42 is disposed throughout the second region 4, mounting region 2, and first region 3. Although FIG. 1 does not illustrate a mode in which the power-source pattern 42 is disposed in the second region 4 and the mounting region 2, the power-source pattern 42 bypasses the optical element 31 in the mounting region 2 and the second region 4 in the plan view.

The power-source pattern 42 is separated from the signal pattern 41 by an interval in a surface direction (orthogonal to the thickness direction and including the longitudinal direction and the width direction). In this manner, the power-source pattern 42 is insulated from the signal pattern 41.

The power-source pattern 42 integrally includes a power-source wire 45, a third terminal that is not illustrated, and a fourth terminal that is not illustrated.

The power-source wire 45 couples the third terminal and fourth terminal, both of which are not illustrated. The third terminal and fourth terminal are disposed in the first region 3 and the second region 4, respectively. Another power source wire is connected to the third terminal. An external board (for example, a printed wiring board) is connected to the fourth terminal. The external board has a structure to which a power source is input from the outside.

The second conductive layer 18 is adjacent to one side in the thickness direction of the first conductive layer 17. The second conductive layer 18 is disposed at the one side in the thickness direction of the first conductive layer 17 via the intermediate insulating layer 14, which is described next. In this manner, the second conductive layer 18 is insulated from the first conductive layer 17.

The second conductive layer 18 overlaps the signal wire 43 and the power-source wire 45 in the thickness direction but does not overlap the first terminal 44, the second terminal (not illustrated), the third terminal (not illustrated), and the fourth terminal (not illustrated). Each of the signal wire 43 and power-source wire 45 includes an overlap portion 47 that overlaps the second conductive layer 18 and a non-overlap portion 48 that does not overlap the second conductive layer 18.

The second conductive layer 18 and the metal supporting layer 11 hold the above-described overlap portion 47 of the first conductive layer 17 therebetween in the thickness direction.

The second conductive layer 18 includes a ground portion that can connect with an external ground member at an end that is not illustrated. That is, the second conductive layer 18 is also a shield layer. Thus, the second conductive layer 18 includes a shield pattern 50.

Consequently, the two shield layers (metal supporting layer 11 and second conductive layer 18) hold the overlap portion 47 of the first conductive layer 17 therebetween in the thickness direction.

Examples of the material of each of the conductive layers 17 and 18 include conductors such as copper. Each of the conductive layers 17 and 18 has a thickness of, for example, 2 µm or more, preferably 4 µm or more, and, for example, 50 µm or less, preferably 25 µm or less.

The intermediate insulating layer 14 is disposed between the conductive layers 17 and 18. Specifically, the intermediate insulating layer 14 intervenes between the first conductive layer 17 and the second conductive layer 18. The intermediate insulating layer 14 is in contact with a one-side surface in the thickness direction of each of the signal wire 43 and the power-source wire 45, with both side surfaces in the thickness direction of each of the signal wire 43 and the power-source wire 45, and with the one-side surface in the thickness direction of the insulating base layer 12 around the first conductive layer 17. Further, the intermediate insulating layer 14 is in contact with the other-side surface in the thickness direction of the second conductive layer 18. Thus, the second conductive layer 18 is disposed on a one-side surface in the thickness direction of the intermediate insulating layer 14.

The intermediate insulating layer 14 insulates the two patterns in the first conductive layer 17, namely, the power-source pattern 42 and the signal pattern 41. Specifically, the intermediate insulating layer 14 intervenes between the power-source wire 45 and the signal wire 43.

The intermediate insulating layer 14 exposes the first terminal 44, the second terminal (not illustrated), the third terminal (not illustrated), and the fourth terminal (not illustrated).

Examples of the material of the intermediate insulating layer 14 include resins such as polyimide. The intermediate insulating layer 14 has a thickness of, for example, 2 μm or more, and, for example, 50 μm or less.

The insulating cover layer 15 is disposed at the one-side surface in the thickness direction of the intermediate insulating layer 14 to cover the second conductive layer 18. The insulating cover layer 15 is in contact with the one-side surface in the thickness direction of the second conductive layer 18 and both side surfaces in the thickness direction of the second conductive layer 18, and with the one-side surface in the thickness direction of the intermediate insulating layer 14 around the second conductive layer 18. The insulating cover layer 15 exposes the first terminal 44, the second terminal (not illustrated), the third terminal (not illustrated), and the fourth terminal (not illustrated). Examples of the material of the insulating cover layer 15 include resins such as polyimide. The insulating cover layer 15 has a thickness of, for example, 2 μm or more, and, for example, 50 μm or less.

Next, a method for producing the opto-electric hybrid board 1 is described with FIG. 2A to FIG. 3I.

As illustrated in FIG. 2A, in this method, a metal sheet 49 is prepared first. The metal sheet 49 is a sheet for forming the metal supporting layer 11.

As illustrated in FIG. 2B, next, the insulating base layer 12 is formed on a one-side surface in the thickness direction of the metal sheet 49. For example, a photosensitive resin composition containing a resin is applied on the whole of the one-side surface in the thickness direction of the metal sheet 49 to form a photosensitive film, and the formed film is subjected to photolithography to form the insulating base layer 12.

As illustrated in FIG. 2C, next, the first conductive layer 17 is formed on the one-side surface in the thickness direction of the insulating base layer 12. Examples of the method of forming the first conductive layer 17 include an additive method and a subtractive method.

As illustrated in FIG. 2D, next, the intermediate insulating layer 14 is formed on surfaces of the insulating base layer 12 and first conductive layer 17 (including the one-side surfaces in the thickness direction). For example, a photosensitive resin composition containing a resin is applied on the surfaces of the insulating base layer 12 and first conductive layer 17 to form a photosensitive film, and the formed film is subjected to photolithography to form the intermediate insulating layer 14.

As illustrated in FIG. 2E, the second conductive layer 18 is formed on the one-side surface in the thickness direction of the intermediate insulating layer 14. Examples of the method of forming the second conductive layer 18 include an additive method and a subtractive method.

As illustrated in FIG. 2F, the insulating cover layer 15 is formed on surfaces of the intermediate insulating layer 14 and second conductive layer 18 (including the one-side surfaces in the thickness direction). For example, a photosensitive resin composition containing a resin is applied on the surfaces of the intermediate insulating layer 14 and second conductive layer 18 to form a photosensitive film, and the formed film is subjected to photolithography to form the insulating cover layer 15.

As illustrated in FIG. 2G, the outer shape of the metal sheet 49 is processed by, for example, etching to form the metal supporting layer 11 having the opening portion 16.

In this manner, the electric circuit board 6 is formed.

Figure 3H:
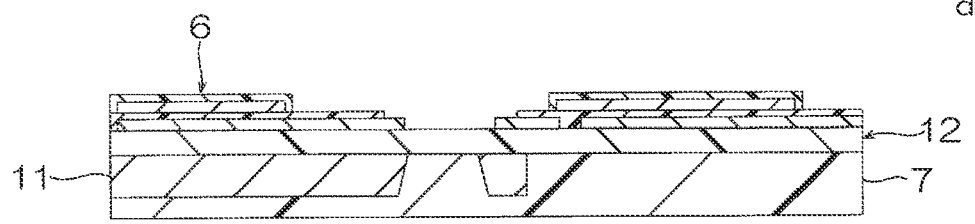
FIG. 3H illustrates a step of forming an under-cladding layer.
Figure 3I:
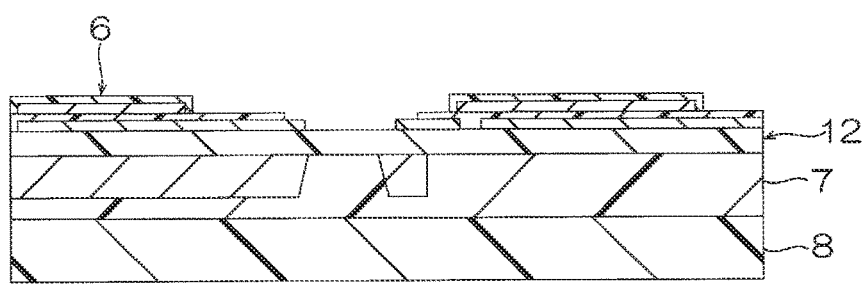
FIG. 3I illustrates a step of forming a core layer.
Figure 3J:
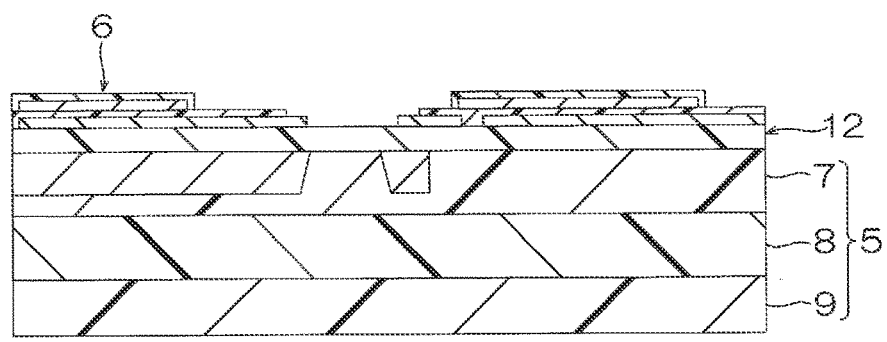
FIG. 3J illustrates a step of forming an over-cladding layer.

Thereafter, as illustrated in FIG. 3H to FIG. 3J, the optical waveguide 5 is formed on the other-side surface in the thickness direction of the electric circuit board 6.

Specifically, as illustrated in FIG. 3H, first, a photosensitive resin composition containing the material of the under-cladding layer 7 is applied on the other-side surfaces in the thickness direction of the metal supporting layer 11 and insulating base layer 12 of the electric circuit board 6 to form a photosensitive film. Thereafter, the photosensitive film is subjected to photolithography to form the under-cladding layer 7.

As illustrated in FIG. 3I, subsequently, a photosensitive resin composition containing the material of the core layer 8 is applied on the other-side surface in the thickness direction of the under-cladding layer 7 to form a photosensitive film. Thereafter, the photosensitive film is subjected to photolithography to form the core layer 8.

As illustrated in FIG. 3J, thereafter, a photosensitive resin composition containing the material of the over-cladding layer 9 is applied on the other-side surfaces in the thickness direction of the under-cladding layer 7 and the core layer 8 to form a photosensitive film. Thereafter, the photosensitive film is subjected to photolithography to form the over-cladding layer 9.

Figure 3K:
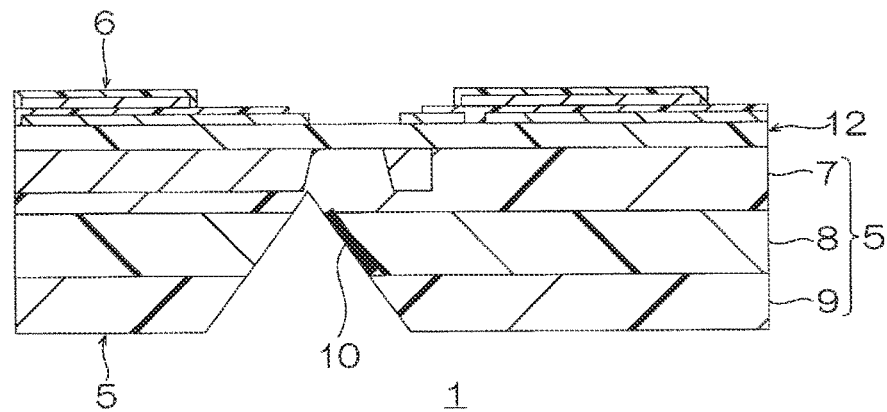
FIG. 3K illustrates a step of forming a mirror.

As illustrated in FIG. 3K, thereafter, the mirror 10 is formed in the core layer 8.

In this manner, the optical waveguide 5 is formed.

In this manner, the opto-electric hybrid board 1 is produced.

Thereafter, as illustrated in FIG. 1, the optical element 31 is mounted on the electric circuit board 6 of the opto-electric hybrid board 1.

The optical element 31 has an approximately rectangular shape in the cross-sectional view. The optical element 31 includes the electrode 33 and an incoming and outgoing port 32, both of which are located on the other-side surface in the thickness direction.

Two electrodes 33 are disposed in the longitudinal direction and separated from each other by an interval. The electrodes 33 each have a shape extending in the thickness direction.

The incoming and outgoing port 32 is disposed between the two electrodes 33, and is specifically located at a central portion in the longitudinal direction of the other-side surface in the thickness direction of the optical element 31. The incoming and outgoing port 32 has a structure that allows the light to enter and exit.

To mount the optical element 31 on the electric circuit board 6, first, a bump 34 is disposed (placed) on a one-side surface in the thickness direction of the first terminal 44 of the signal pattern 41. Examples of the bump 34 include members that can be molten, specifically, such as gold or a solder.

Subsequently, through the bump 34, the electrode 33 and the first terminal 44 are joined. Examples of the joining method include ultrasonic joining where ultrasonic vibrations are given to the first terminal 44 to melt the bump 34 and thermal compression bonding using a conductive adhesive.

In this manner, the optical element 31 is electrically connected with the signal wire 43.

The second terminal (not illustrated) of the signal pattern 41 is connected to the external board (not illustrated).

The third terminal and fourth terminal (not illustrated) of the power-source pattern 42 are connected to the power source wire and the external board (not illustrated), respectively.

Further, the ground portion of each of the metal supporting layer 11 and the second conductive layer 18 (the shield layers) is electrically connected to an external ground member to allow the metal supporting layer 11 and the second conductive layer 18 to function as a shield layer.

In the opto-electric hybrid board 1, light is transmitted from the one side in the longitudinal direction of the core layer 8 and the optical path of the light is converted by the mirror 10. The light enters the incoming and outgoing port 32 and is converted into an electrical signal by the optical element 31. The electrical signal is input to the external board via the signal pattern 41.

In the opto-electric hybrid board 1, the electrical signal is input from the external board via the signal pattern 41 to the optical element 31 and converted into an optical signal by the optical element 31. The optical signal exits from the incoming and outgoing port 32 toward the mirror 10. The optical path of the optical signal is converted by the mirror 10, and thereafter transmitted toward the one side in the thickness direction.

Further, the power source current input from the power-supply device is input through the power-source pattern 42 to the external board.

On the other hand, the noise on the signal wire 43 and the power-source pattern 42 is suppressed by the metal supporting layer 11 and the second conductive layer 18 (shield patterns 50).

<Operations and Effects of One Embodiment>

In the opto-electric hybrid board 1, the metal supporting layer 11 and the second conductive layer 18 are shield layers. Thus, the noise on the first conductive layer 17 can be suppressed.

Although not illustrated, if the first terminal 44 is disposed on the one-side surface in the thickness direction of the intermediate insulating layer 14 and then the optical element 31 is mounted thereon, the intermediate insulating layer 14 and the insulating base layer 12 intervene between the incoming and outgoing port 32 and the mirror 10. This makes the distance between the incoming and outgoing port 32 and the mirror 10 relatively long.

On the other hand, as the opto-electric hybrid board 1 does, when the optical element 31 is mounted on the first terminal 44 disposed on the one-side surface in the thickness direction of the insulating base layer 12, the intermediate insulating layer 14 is not disposed between the optical element 31 and the mirror 10, and only the insulating base layer 12 intervenes as an insulating layer therebetween. Thus, a distance L between the incoming and outgoing port 32 and (the center in the longitudinal direction of) the mirror 10 in the thickness direction can be shortened.

Thus, the optical coupling loss between the optical element 31 and the optical waveguide 5 can be reduced.

On the assumption that the opto-electric hybrid board 1 is projected in the thickness direction, the metal supporting layer 11 and the second conductive layer 18 overlap the overlap portion 47 of the first conductive layer 17. Thus, the metal supporting layer 11 and the second conductive layer 18 surely suppress the noise on the first conductive layer 17.

The opto-electric hybrid board 1 can simultaneously transmit signals and electricity by using the signal wire 43 and the power-source wire 45, and further can suppress the noise thereon by using the two shield layers (the metal supporting layer 11 and the second conductive layer 18).

When the first terminal 44 of the opto-electric hybrid board 1 is given ultrasonic vibrations to mount the optical element 31 on the first terminal 44, the first terminal 44 overlaps the metal supporting layer 11 and thus the metal supporting layer 11 with high stiffness can absorb the vibration energy of the ultrasound. This absorption ensures the melting of the bump 34. Thus, the optical element 31 is surely mounted on the first terminal 44 via the bump 34.

<Variations>

In each of the following variations, the same members and steps as in the above-described embodiment are given the same numerical references and the detailed descriptions thereof are omitted. Further, the variations can have the same operations and effects as those of the embodiment unless especially described otherwise. Furthermore, the embodiment and the variations can appropriately be combined.

In one embodiment, both of the metal supporting layer 11 and the second conductive layer 18 are shield layers. However, although not illustrated, one of them may be a shield layer. For example, the metal supporting layer 11 is a shield layer while the second conductive layer 18 includes a power-source wire and/or a signal wire. Alternatively, the second conductive layer 18 is a shield layer while the metal supporting layer 11 includes a power-source wire and/or a signal wire.

Preferably, as one embodiment demonstrates, both of the metal supporting layer 11 and the second conductive layer 18 are shield layers. In such a structure, the first conductive layer 17 is held between the two shield layers from both sides in the thickness direction. This structure can improve the suppression of the noise to the first conductive layer 17.

Further, one embodiment demonstrates that the first terminal 44 and the signal wire 43 are disposed on the same flat surface. In other words, the first terminal 44 and the signal wire 43 are disposed on the one-side surface in the thickness direction of the insulating base layer 12 and both of the first terminal 44 and the signal wire 43 are included in the first conductive layer 17. However, although not illustrated, the first terminal 44 may be disposed on the one-side surface in the thickness direction of the insulating base layer 12 while the signal wire 43 may be disposed on the one-side surface in the thickness direction of the intermediate insulating layer 14 and included in the second conductive layer 18. In this variation, a coupling line (not illustrated) extending in the thickness direction couples the first terminal 44 with the signal wire 43 in the thickness direction.

Also in this variation, the first terminal 44 is disposed on the one-side surface in the thickness direction of the insulating base layer 12, and thus the above-described distance L can be shortened. Thus, the optical coupling loss between the optical element 31 and the optical waveguide 5 can be reduced.

One embodiment uses ultrasonic joining as an example of the method of connecting the electrode 33 of the optical element 31 and the first terminal 44. However, the method is not limited to the ultrasonic joining. For example, a reflow method can also be used.

Ultrasonic joining is preferable. Reflow methods tend to damage the optical element 31 by heating. However, ultrasonic joining as demonstrated in one embodiment can suppress the above-described damage.

Meanwhile, ultrasonic joining transmits the vibration energy to the soft optical waveguide 5 and tends to pass the energy to the other side in the thickness direction. However, in one embodiment, the metal supporting layer 11 overlaps the first terminal 44, and the metal supporting layer 11 with high stiffness can absorb the vibration energy of the ultrasound. This ensures the melting of the bump 34. Therefore, while the damage to the optical element 31 is suppressed, the optical element 31 can surely be mounted on the first terminal 44.

Figure 4:
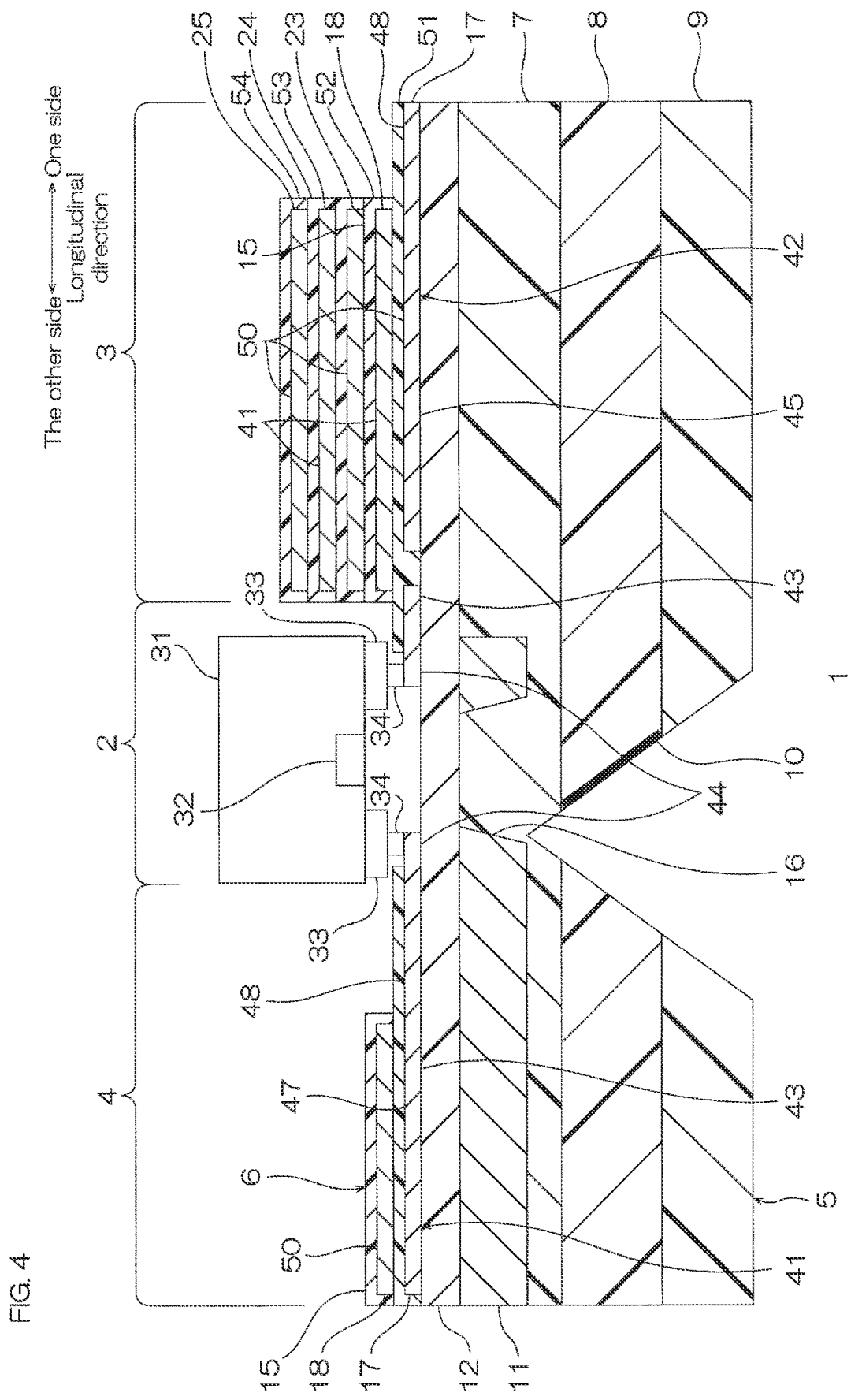
FIG. 4 illustrates a variation of the opto-electric hybrid board illustrated in FIG. 1 (an opto-electric hybrid board further including third to fifth conductive layers).

The number of the conductive layers is two in one embodiment but may be three or more. FIG. 4 illustrates a variation having five layers.

In this variation, the conductive layers include a first conductive layer 17, a second conductive layer 18, a third conductive layer 23, a fourth conductive layer 24, and a fifth conductive layer 25. The first conductive layer 17, the second conductive layer 18, the third conductive layer 23, the fourth conductive layer 24, and the fifth conductive layer 25 are sequentially disposed toward the one side in the thickness direction.

The intermediate insulating layer 14 includes a first intermediate insulating layer 51 to a fourth intermediate insulating layer 54.

The first region 3 includes a part (laminate structure) in which the first conductive layer 17, the first intermediate insulating layer 51, the second conductive layer 18, the second intermediate insulating layer 52, the third conductive layer 23, the third intermediate insulating layer 53, the fourth conductive layer 24, the fourth intermediate insulating layer 54, and the fifth conductive layer 25 are sequentially disposed toward the one side in the thickness direction.

In this variation, the first conductive layer 17 does not include, for example, the power-source pattern 42 (see FIG. 1).

The first conductive layer 17 includes shield patterns 50 in the first region 3. The shield patterns 50 are included in the first conductive layer 17, the third conductive layer 23, and the fifth conductive layer 25, respectively, in the first region 3.

On the other hand, the signal patterns 41 are included in the second conductive layer 18 and the fourth conductive layer 24, respectively, in the first region 3.

In other words, in the first region 3, the signal patterns 41 and the shield patterns 50 are alternately disposed toward the one side in the thickness direction. In addition, each of the signal patterns 41 is held between the shield patterns 50 disposed at both sides of the signal patterns 41 in the thickness direction.

Figure 5:
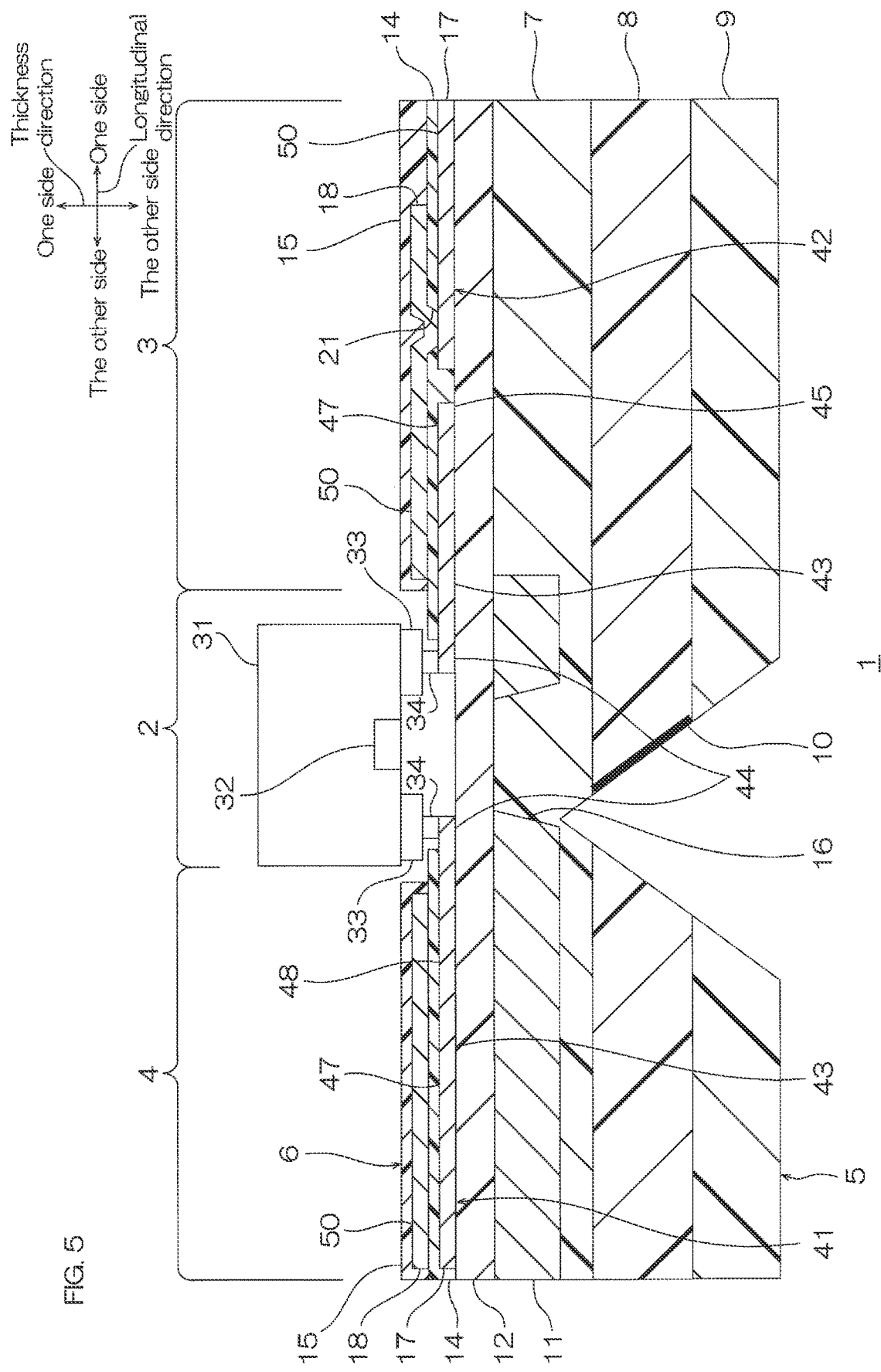
FIG. 5 illustrates a variation of the opto-electric hybrid board illustrated in FIG. 1 (an opto-electric hybrid board including a first region where the first conductive layer and the second conductive layer are shield layers).

In the variation of FIG. 5, the shield pattern 50 included in the second conductive layer 18 of the second region 4 overlaps the whole of the signal wire 43 of the second region 4 in the thickness direction. In other words, the variation of FIG. 5 demonstrates that one edge in the longitudinal direction of the shield pattern 50 is close to the mounting region 2 in comparison with the one edge in the longitudinal direction of the shield pattern 50 of one embodiment as illustrated in FIG. 1.

In this variation, the first conductive layer 17 does not include a non-overlap portion 48 that does not overlap the shield pattern 50 (see FIG. 1).

In the first region 3 of this variation, the shield patterns 50 are included in the first conductive layer 17 and the second conductive layer 18.

In the first region 3, the first conductive layer 17 including the shield pattern 50 extends from the one side to a middle part in the longitudinal direction.

The intermediate insulating layer 14 includes an insulating opening portion 21 corresponding to the other edge in the longitudinal direction of the first conductive layer 17. The insulating opening portion 21 penetrates the intermediate insulating layer 14 in the thickness direction.

The second conductive layer 18 of the first region 3 is in contact with the one-side surface in the thickness direction of the intermediate insulating layer 14, an inside surface of the intermediate insulating layer 14 defining the insulating opening portion 21, and a one-side surface in the thickness direction of the first conductive layer 17 located inside relative to the insulating opening portion 21.

In this variation, the shield pattern 50 of the second region 4 is close to the first region 3, and thus the region that can be shielded can be extended near the optical element 31.

Figure 6:
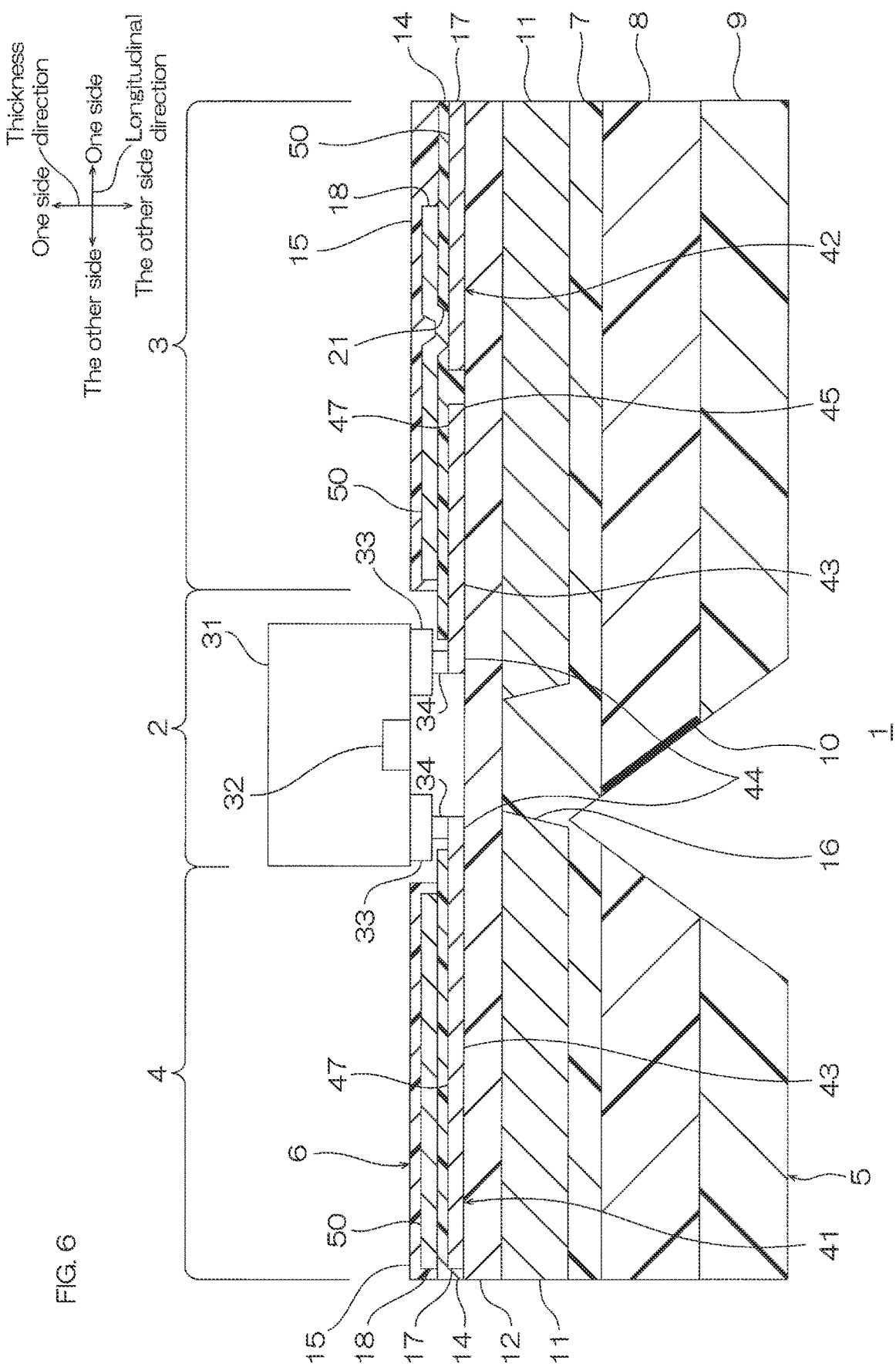
FIG. 6 illustrates a variation of the opto-electric hybrid board illustrated in FIG. 5 (an opto-electric hybrid board where the metal supporting layer is disposed also in the first region).

As illustrated in FIG. 6, the metal supporting layer 11 that is a shield layer is disposed in the first region 3. In other words, the metal supporting layer 11 is disposed throughout all of the mounting region 2, the first region 3, and the second region 4.

As illustrated in FIG. 7B, the electric circuit board 6 further includes the other-side conductive layer 55 and the other-side insulating layer 56.

The other-side conductive layer 55 is disposed on the other-side surface in the thickness direction of the insulating base layer 12 of the first region 3. The other-side conductive layer 55 functions, for example, as a shield layer.

The other-side insulating layer 56 is in contact with the other-side surface in the thickness direction of the insulating base layer 12 and the other-side surface and peripheral side surface in the thickness direction of the other-side conductive layer 55 in the first region 3. A back side (including the other-side surface in the thickness direction) of the other-side insulating layer 56 is in contact with the under-cladding layer 7.

To produce the opto-electric hybrid board 1, the electric circuit board 6 illustrated in FIG. 2G is produced, and then the other-side conductive layer 55 and the other side insulating layer 56 are sequentially formed as illustrated in FIG. 7A. Thereafter, as illustrated in FIG. 7B, the optical waveguide 5 is formed at a back side of the metal supporting layer 11 and insulating base layer 12 (including the other-side surface in the thickness direction).

Figure 8:
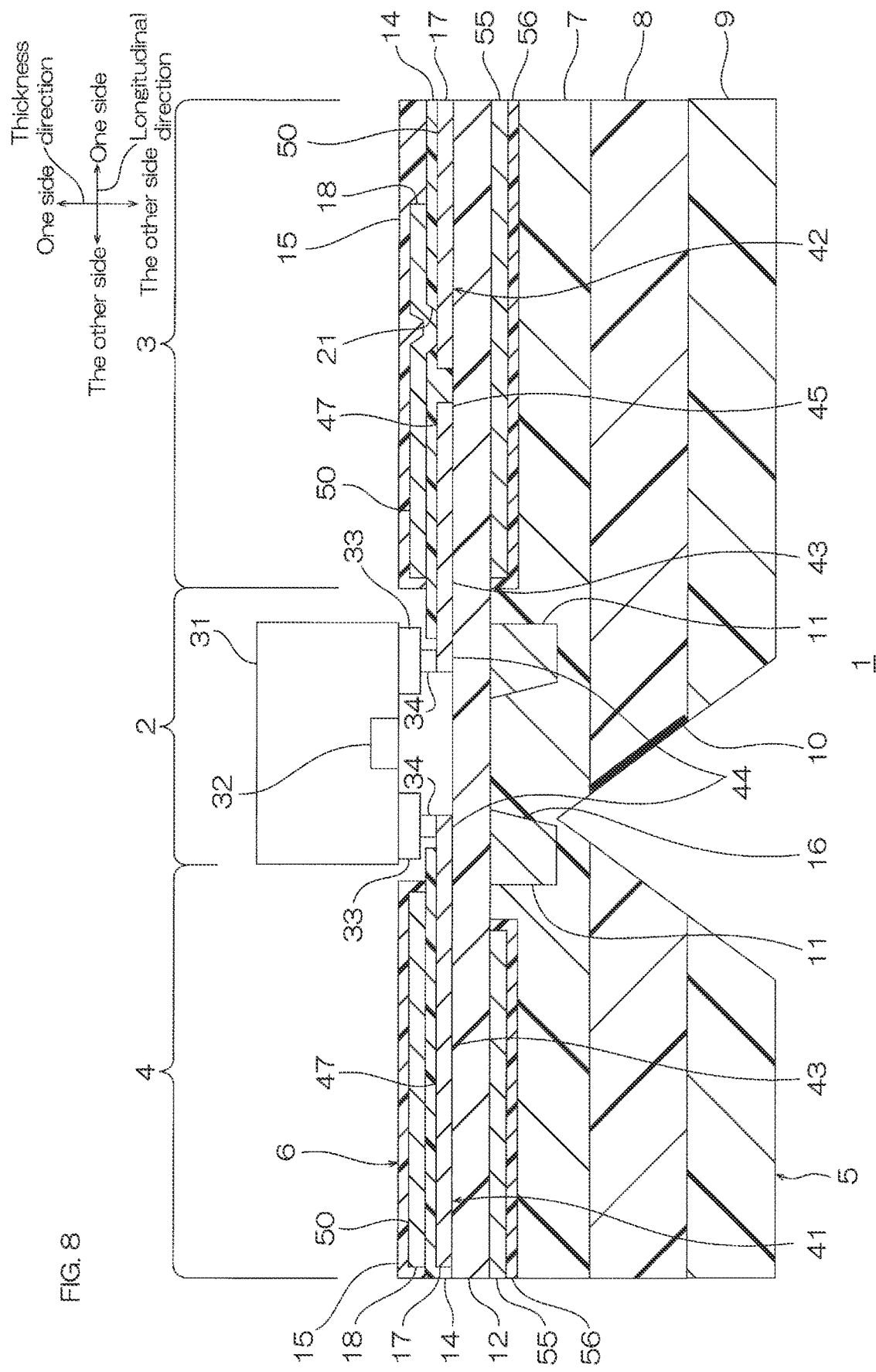
FIG. 8 illustrates a variation of the opto-electric hybrid board illustrated in FIG. 1 (an opto-electric hybrid board where the metal supporting layer is disposed only in the mounting region).

In the variation as illustrated in FIG. 8, the other-side conductive layer 55 and the other-side insulating layer 56 are further disposed in the second region 4. On the other hand, the second region 4 does not include a metal supporting layer 11. In other words, the metal supporting layer 11 is not disposed in the first region 3 nor the second region 4, and is disposed only in the mounting region 2.

However, the metal supporting layer 11 of the mounting region 2 overlaps the first terminal 44 in the thickness direction. While functioning as a shield layer, the metal supporting layer 11 absorbs the vibration energy during the ultrasonic joining of the optical element 31 to the first terminal 44. Thus, the bump 34 can surely be molten.

Figure 9:
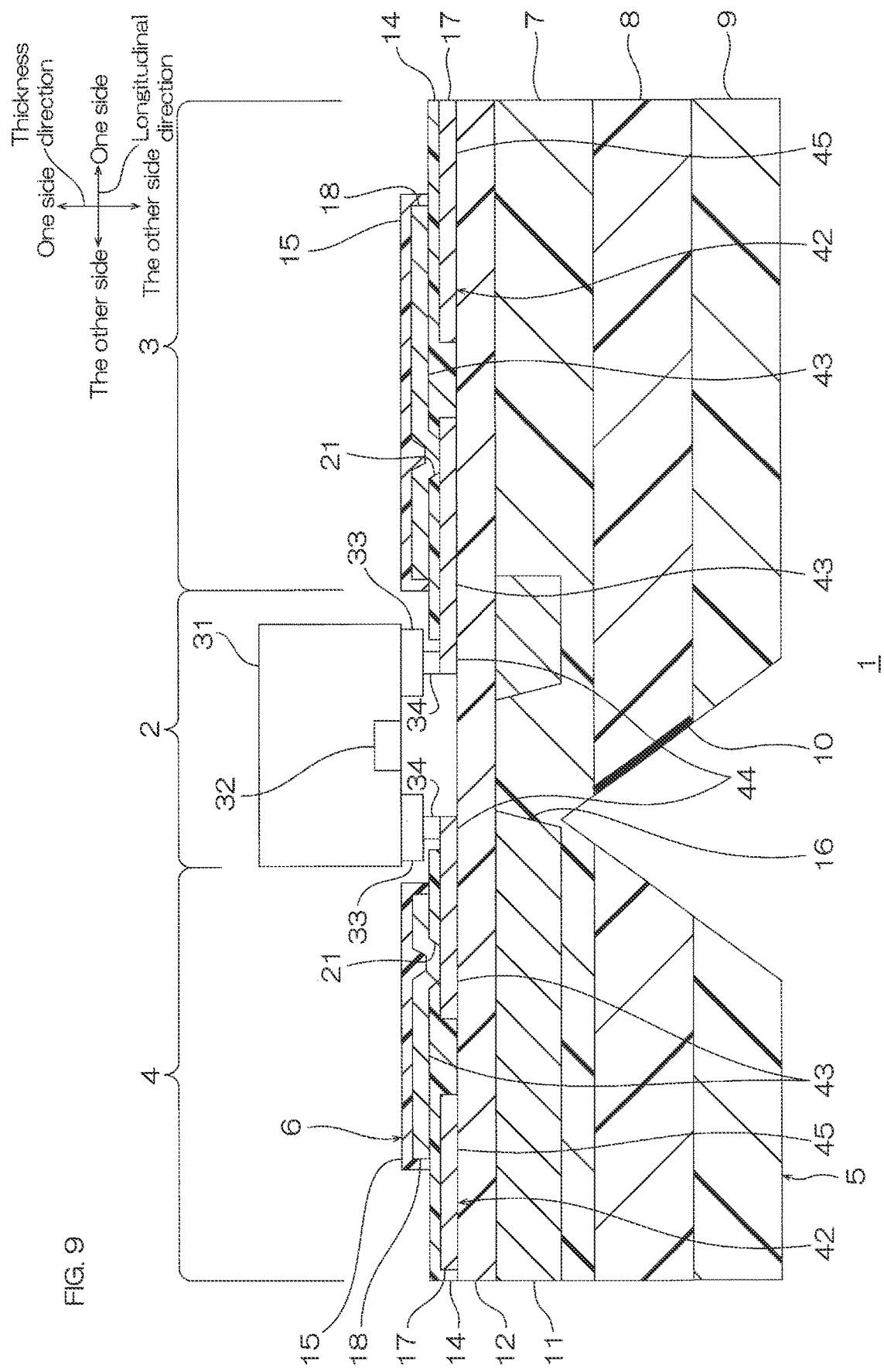
FIG. 9 illustrates a variation of the opto-electric hybrid board illustrated in FIG. 5 (an opto-electric hybrid board where the power-source patterns are included in the first conductive layer, and the signal patterns are included in the first conductive layer and the second conductive layer).

In the variation illustrated in FIG. 9, the power-source pattern 42 is included in the first conductive layer 17. On the other hand, the signal patterns 43 are included in the first conductive layer 17 and the second conductive layer 18. In this variation, the metal supporting layer 11 functions as a shield layer.

Figure 10:
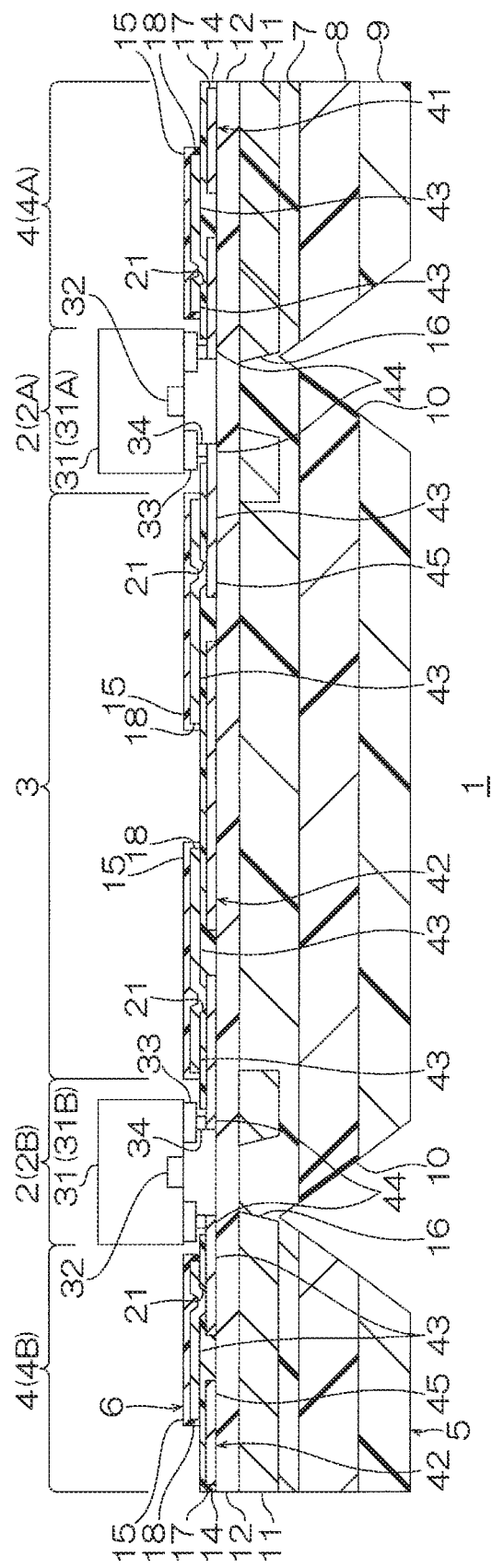
FIG. 10 illustrates a variation of the opto-electric hybrid board illustrated in FIG. 9.

As illustrated in FIG. 10, the opto-electric hybrid board 1 includes a plurality of (for example, two) optical elements 31. The optical elements 31 are disposed in the longitudinal direction and separated from each other by an interval.

The optical elements 31 are, for example, a first optical element 31A and a second optical element 31B.

The opto-electric hybrid board 1 includes two mounting regions 2, one first region 3, and two second regions 4.

The two mounting regions 2 are a one-side mounting region 2A disposed at one side in the longitudinal direction and the other-side mounting region 2B disposed at the other side in the longitudinal direction, respectively. The one-side mounting region 2A and the other-side mounting region 2B hold the first region 3 therebetween in the longitudinal direction. The first optical element 31A is mounted on the one-side mounting region 2A. The second optical element 31B is mounted on the other-side mounting region 2B.

The two second regions 4 are a one-side second region 4A disposed at the one side in the longitudinal direction and the other-side second region 4B disposed at the other side in the longitudinal direction. The one-side second region 4A continues to the one side in the longitudinal direction of the one-side mounting region 2A. The other-side second region 4B continues to the other side in the longitudinal direction of the other-side mounting region 2B.

The opto-electric hybrid board 1 illustrated in FIG. 10 is produced as a line symmetry formed by coupling the opto-electric hybrid board 1 illustrated in FIG. 9 with another opto-electric hybrid board 1 while putting the other end in the longitudinal direction of the opto-electric hybrid board 1 illustrated in FIG. 9 as the line of symmetry. In the opto-electric hybrid board 1, the one end in the longitudinal direction of the power-source wire 45 of the power-source pattern 42 is connected to one of the external boards (not illustrated) while the other end in the longitudinal direction of the power-source wire 45 is connected to the other external board (not illustrated).

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The opto-electric hybrid board is used for optics and electrics.
1 opto-electric hybrid board
5 optical waveguide
6 electric circuit board
11 metal supporting layer (exemplary shield layer)
12 insulating base layer
14 intermediate insulating layer
17 first conductive layer
18 second conductive layer (exemplary shield layer)
23 third conductive layer
24 fourth conductive layer
25 fifth conductive layer
31 optical element
43 signal wire.
14 first terminal
45 power-source wire
51 first intermediate insulating layer
52 second intermediate insulating layer
53 third intermediate insulating layer
54 fourth intermediate insulating layer
55 other-side conductive layer (exemplary shield layer)

The invention claimed is:

1. An opto-electric hybrid board comprising:
an optical waveguide and an electric circuit board disposed sequentially toward one side in a thickness direction;
wherein the electric circuit board includes:
a metal supporting layer;
an insulating base layer disposed on an upper surface of the metal supporting layer in the thickness direction;
a plurality of conductive layers sequentially disposed in the thickness direction and including a first conductive layer disposed on an upper surface of the insulating base layer in the thickness direction; and
an intermediate insulating layer disposed between the conductive layers;
at least one layer selected from a group consisting of the metal supporting layer and the conductive layers, is a shield layer electrically insulated from each other layer of the group;
the metal supporting layer is stainless steel;
the first conductive layer includes a power-source wire and/or a signal wire;
the second conductive layer contains copper;
the metal supporting layer and a second conductive layer adjacent to one side of the first conductive layer among the conductive layers in the thickness direction, are shield layers;
at least one of the conductive layers includes a terminal for mounting an optical element, and
the terminal is disposed on the upper surface of the insulating base layer in the thickness direction.

2. The opto-electric hybrid board according to claim 1, wherein the shield layer overlaps each other layer of the group in the thickness direction.

3. The opto-electric hybrid board according to claim 1, wherein each other layer of the group includes a power-source wire and a signal wire.

4. The opto-electric hybrid board according to claim 1, wherein the metal supporting layer overlaps the terminal in the thickness direction.

* * * * *